United States Patent Office 2,814,589

Patented Nov. 26, 1957

2,814,589

METHOD OF PLATING SILICON

Maynard C. Waltz, Maplewood, N. J., assignor to Bell Telephone Laboratories, Incorporated, New York, N. Y., a corporation of New York No Drawing. Application August 2, 1955, Serial No. 526,065

3 Claims. (Cl. 204—37)

This invention relates to plating baths and more particularly to plating baths for semiconductive bodies which are predominantly silicon and to methods and compositions used therewith.

Useful adherent metallic deposits by electro-deposition of other metals on articles made of silicon or silicon alloys have in the past been obtained only with much difficulty. This element has an unusually great affinity for oxygen and, regardless of the specific metallurgical process involved in its production, metallic silicon has invariably been obtained with a stable, particularly unreactive oxide coating its surface. Silicon dioxide cannot readily be put into solution, being attacked appreciably by none of the common solvents. On exposure to air a silicon surface becomes covered with a coherent, thin but tenacious film of oxidized nature which instantly renews itself on abrasion. Electroplating with such a surface has led only to a very inferior deposition of metal layers on silicon, since applied metals cannot form strong metallic type bonds with the underlying silicon and do not adhere well to silicon dioxide. Plated metal over an oxidized silicon surface also offered poor electrical characteristics, a fact which has become more significant over recent years as the quality of silicon available for use in electrical devices has been improved. The usual complex methods of treating a surface by buffing, polishing, etching or chemical reduction have therefore failed to prepare and maintain a true metallic surface at the time when the article of silicon is immersed in the plating bath. Heretofore, the problem has been that with the usual methods of plating and with the usual plating baths, disposition of the oxide coating on silicon surfaces prior to deposition of metal has not been obtained and only inferior plating has resulted.

It is accordingly the principal object of the present invention to permit a metal to be plated directly on silicon with no intermediate oxide layer, and more particularly to provide a predominantly silicon body with a tenacious high conductivity metallic plating suitable for a solder contact.

Another object of the invention is to simplify plating of metals on silicon.

Another object of the invention is to provide a new plating bath for the electrodeposition of copper on silicon surfaces.

A further object of the invention is to improve the electrodeposition of metals on silicon and the methods and compositions used therefor. More specifically an object of the invention is to obtain a process for producing a coating adapted for use as an intermediate between a body which is predominantly silicon and a solder contact.

A still further object of the invention is to obtain a process for plating copper on silicon which may be maintained in commercial operation for long periods of time with a minimum amount of regulation.

In general in specific embodiments of this invention I have discovered that a high quality metallic plate can be applied directly to silicon with no intermediate oxide layer when the silicon surface is exposed to a plating solution containing silica dissolving ions. Fluoride ions attack silica and have been found to be compatible with a number of plating compositions for silicon from which various metals can be derived. In particular metallic layers have been plated on silicon surfaces in accordance with this invention by displacement plating, i. e., without the application of an external electromotive force, and by electrolytic processes, both from plating solutions containing hydrofluoric acid.

In accordance with one feature of this invention, a tenacious metallic plating is deposited on a predominantly silicon surface by utilizing a plating bath containing metal ions together with ions which will selectively dissolve silica.

In accordance with another feature of this invention, a continuous tenacious layer of high conductivity copper having substantially non-rectifying characteristics is deposited upon a de-oxidized surface of a semiconductive body of silicon. More specifically in accordance with this feature of this invention, a tenacious layer of high conductivity copper is deposited on a predominantly silicon surface in an aqueous solution of copper sulfate containing hydrofluoric acid.

More particularly in accordance with another feature of this invention, a metallic plating is bonded to a predominantly silicon body by removal of the oxide film concomitantly with deposition of metal ions, thereby increasing the tenacity of the plating, even without the application of an external electromotive force.

The invention and the above noted and other objects and features thereof will be understood more clearly and fully from the following detailed description of the preparation and application of copper and other plating baths illustrating specific embodiments of the invention.

In the following example, which will serve to illustrate one specific embodiment of the invention with greater particularity, a small silicon wafer is obtained in the form of a slice from a single crystal ingot of N-type silicon which has been prepared by the usual crystal pulling process. Such a slice may, for example, have a thickness of 0.020 inch, be 0.040 inch on an edge and have a resistivity in the range of 0.03–20 ohm centimeters. Each major surface of the silicon slice is cleaned following the cutting operation. A typical technique is to polish the surface abrasively and follow with a chemical etching operation. Subsequently the particular surfaces to be treated further may be lapped to a matte finish and plated according to the present invention.

The composition of the plating bath and the methods of metal deposition employed are identical whether the invention is to be applied to silicon or to a silicon alloy. An alloyed wafer of silicon might, for example, be one fabricated by plating a gold-antimony layer on the major face of the wafer and subjecting it to an alloying process. This plating can be accomplished from a solution of potassium ferrocyanide, potassium gold cyanide, potassium antimonyl tartrate, and water, in accordance with conventional electroplating techniques. After the gold-antimony plate has been applied the silicon wafer is subjected to an alloying process involving heating to 920 degrees centigrade for five to ten minutes and cooling to 100 degrees centigrade over a ten minute interval, thereby forming a high conductivity N-type silicon surface having an underlying N-type silicon region of relatively low conductivity. This alloyed ohmic contact area can then be prepared for soldering by plating with copper according to the present invention.

The aqueous copper plating bath may be prepared by dissolving approximately 375 grams of copper sulfate, $CuSO_4.5H_2O$, and approximately 5.5 grams of hydrofluoric acid, $H_2F_2$, in a liter of water. This example corresponds to a copper sulfate solution containing about 1 percent by volume reagent strength concentrated hydrofluoric acid, specifically, 1 percent by volume of a 48 percent by weight aqueous solution of $H_2F_2$. In the practice of this invention, as with the usual type of acid copper sulfate bath, sulphuric acid may be added as desired in order to suitably adjust the conductivity of the plating bath.

The alloyed silicon wafer to be plated is made the cathode in the electrolytic process and a copper rod may be employed as an anode. When a suitable electric current, for example about 150 milliamperes, is passed through the solution of copper sulfate and hydrofluoric acid, a strongly adherent plating of copper forms on the silicon surface which has according to this invention been purged of oxide coating simultaneously with the deposition of the copper plate on the freshly reduced surface. A copper plate produced by this method is tenacious, has symmetrical electrical characteristics, and is particularly ideal as a surface on which a solder contact may be produced.

The advantages of obtaining a metal plating directly on a silicon surface rather than on an overlying oxidized layer are very important where exceedingly sensitive semiconductive devices are involved. By utilizing the invention herein described, not only is it now possible to obtain a strongly bonded metallic layer on a silicon surface, but even more important, the anomalous low frequency rectification behavior of certain types of silicon elements which resulted from the capacitance of the dielectric layer of silica between the silicon surface and the metal plate has been completely eliminated. Standard electrical measurements indicate that processes in accordance with specific embodiments of the invention are effective in producing a plated silicon body which does not show any oxidized surface capacitance between the silicon and the plating.

Variables of temperature, current density and agitation are interrelated in their effect on the plating operation of this invention. All three may be closely controlled by standardization and instrumentation but none is of itself critical in the process described. It is good practice, however, to operate at the highest values of temperature and current density consistent with the limitation imposed by the quality of deposit required or by the equipment. The copper plating bath will attain an equilibrium temperature in continuous operation which is determined by such factors as its resistivity, the anode-to-cathode spacing, the particular chemical reaction, the amperes per liter employed and the heat losses. Facilities can be provided for heating or cooling if the bath is to be operated at other than the equilibrium temperature obtained at room temperature conditions. Excellent results have been obtained when the electrolytic bath was maintained at temperatures of from about 15 degrees centigrade to 70 degrees centigrade, so that this constitutes a preferred range.

A practical operating range of current density for the acid copper sulfate-hydrofluoric acid bath is 20–100 amperes per square foot. The voltage drop is maintained at least as great as the polarographic potential of the metal in the plating solution.

While it may be desirable in some instances to use agitation, namely, cathode movement or solution movement, it is not essential to the practice of the invention. Agitation is advantageous, not only because it brings all the solution into contact with the cathode, but also because the removal of dissolved ions of specific impurities is assisted by the lowering of their deposition potentials which occurs with agitation. However, any agitation should be as uniformly distributed as possible to avoid nonuniformities in the structure and thickness of the electrodeposited coating.

Another specific application of the invention is its use for effecting the electrode-less deposition of copper metal on a predominantly silicon body. A thin but tenacious high conductivity copper plating suitable for a solder contact can be deposited on a silicon surface in this plating bath even without the application of an external electromotive force. The cementation reaction, in this case chemical displacement by silicon of copper from a solution of copper sulfate, is possible in the process disclosed herein since the hydrofluoric acid, which is an integral part of the plating bath, functions to attack any silicon dioxide on the silicon surface, thereby exposing a clean area to copper ions in solution. The displacement takes place smoothly and rapidly simultaneously with the dissolution of the overlying layer of oxidized nature on the silicon surface. Preferably a copper plating bath with a hydrofluoric acid concentration which is between 1 gram per liter and 200 grams per liter, is employed. Advantageous results have been obtained using a concentration of about 5 to 100 grams per liter of hydrofluoric acid.

Other conditions being the same, the time during which the electroplating process is carried on relates only to the thickness of the metallic plating deposited on the cathode. While it is apparent that where the coating is of a different lattice habit than the basis-metal, there need not be an atomic lattice continuity at the interface in order to obtain true adhesion, the structure of the deposit with respect to crystal habit and grain size is of importance in determining the mechanical properties of the deposit. When an ion in solution approaches the silicon cathode and is discharged to form a metallic atom, the way in which that atom finds its place in the growing lattice on the basis-metal is determined to some extent by the efficiency of attack of the hydrofluoric acid in solution upon the oxidized coating of the silicon body. This is in turn determined by the concentration of hydrofluoric acid in the plating bath. A few drops or so of concentrated hydrofluoric acid solution in a liter of saturated copper sulfate solution are sufficient to plate successfully a pertinacious mechanically strong layer of copper upon silicon according to this invention. At this relatively low hydrofluoric acid concentration the plating process takes place relatively slowly. Where it is desired that the plating should be accomplished more quickly, a bath with a greater concentration of hydrofluoric acid is employed. However, it should be noted that a large excess of hydrofluoric acid causes an overly vigorous chemical reaction and the resultant plating shows a tendency to peel. The most advantageous copper plating bath for predominantly silicon bodies is an aqueous solution which is saturated in copper sulfate and contains between 15 and 55 grams per liter of hydrofluoric acid, and an acidity within the range from pH 1 to 3.

The following examples will serve to illustrate the invention with greater particularity:

*Example I*

An aqueous bath of the following composition was prepared:

| | | |
|---|---|---|
| Copper sulfate ($CuSO_4.5H_2O$) | g./l. | 300 |
| Hydrofluoric acid (48% $H_2F_2$) | ml./l. | 300 |

A P-type silicon wafer was immersed in the bath which was maintained at room temperature (about 22 degrees centigrade). Plating proceeded very rapidly and within a few minutes the surface of the silicon was coated with a layer of copper.

*Example II*

Another example of a bath is:

| | | |
|---|---|---|
| Copper sulfate ($CuSO_4.5H_2O$) | g./l. | 300 |
| Hydrofluoric acid (48% $H_2F_2$) | ml./l. | 30 |

This bath gave a very good copper plate on silicon at a rate somewhat slower than that observed where baths containing higher concentrations of hydrofluoric acid were used. A strongly adherent layer of copper plate between 0.01 and 0.02 mil thick was deposited within ten minutes.

*Example III*

The bath of Example II was employed, except that in this case the silicon body was immersed as a cathode and a copper rod supplied as an anode. The application of an external electromotive force (about 1 volt) made very little difference to the result obtainable when no external potential was applied to the plating bath. A thicker plating, however, was produced by the reaction under the influence of the applied voltage.

While the concentration of copper sulfate in the examples of copper plating baths which have been given corresponds to a solution approximately saturated in copper sulfate, a more dilute solution of the metal salt may be used. With very dilute solutions the electrolyte immediately adjacent to the silicon body becomes so depleted in metal ions that polarization begins to reduce plating efficiency. Preferably then, the concentration of copper sulfate should be between 200–400 grams of $CuSO_4.5H_2O$ per liter of plating solution. It may be desirable to increase the conductivity of the plating bath and, as with conventional acid copper plating baths, a few milliliters per liter of 95% $H_2SO_4$ can be added for this purpose. Adjustment of the conductivity in this manner is effective only in modifying the rate of plating and does not otherwise influence the chemical processes of the invention.

Copper plating baths may be prepared using compounds other than copper sulfate. Copper salts which are soluble in aqueous acid solution can be employed with hydrofluoric acid to copper plate silicon according to this invention. For example, either copper nitrate or copper chloride is entirely suitable when present with a silica dissolving ion such as $HF_2^-$ or $F^-$.

The electrodeposition of copper by the process disclosed is carried out by the usual electroplating processing techniques. In a typical case N-type silicon wafers 40 mils on an edge and 20 mils thick are cut from a single crystal ingot of silicon having resistivity, for example, in the range of 0.03–20 ohm centimeters. The prepared wafers are placed in a metal basket and immersed in a bath containing copper sulfate and hydrofluoric acid. A suitable anode is a strip of pure copper. Such a plating bath saturated in copper sulfate and containing between 1–3 percent concentrated hydrofluoric acid (48% $H_2F_2$) has a pH of between 1—3. Operating this bath at room temperature with a cathode current density of approximately 20 amperes per square foot, a good deposit of tenacious copper plate about 0.2 mil thick is formed on the surface of the silicon in ten minutes.

The unique application of this plating bath for effecting the electrode-less metal plating of silicon is particularly useful. It simplifies to a marked degree plating processes which by their very complex nature have in the past been fraught with inexplicable technical difficulties. Since hydrofluoric acid alone will not attack silicon, only the surface oxidized layer is removed and as this occurs within the plating bath, the freshly revealed silicon surface is instantly plated with a layer of strongly bonded metal.

It is also possible according to the present invention, to electrodeposit metals other than copper onto silicon.

Metals which form a free metallic ion in acid solution are suitable, for example, zinc, chromium, iron, cadmium, indium, cobalt, nickel, tin, lead, antimony, bismuth, arsenic, silver, rhodium, palladium, platinum, gold or iridium. All of these are metals commonly involved in electroplating processes. In general any metal soluble in acid solution and having an atomic weight between about 52 and 209 can be plated on silicon according to this method. It may be desirable to plate some of these as an intermediate layer between silicon and some other metal, while others may be used directly. Plating baths for depositing on silicon metals other than copper are prepared by dissolving suitable metallic salts in aqueous solution and adding a significant quantity of hydrofluoric acid. With metals whose electrode potentials fall below silicon (about 0.5 volt compared to H at zero) in the electromotive force series of elements, the plating process of this invention proceeds without the application of an external E. M. F. Where the difference in electrode potential between silicon and the metallic element to be deposited thereon is small, an applied potential may be useful in order to bring about a more rapid plating action.

It is to be understood that the above-described plating bath methods and compositions are but illustrative of the application of the principles of the invention. Numerous other arrangements may be devised by those skilled in the art without departing from the spirit and scope of the invention.

What is claimed is:

1. The process of coating a predominantly silicon body comprising electroplating a gold-antimony layer on a major face of a wafer of semiconductive material comprising silicon, heating said wafer to about 920 degrees centigrade for five to ten minutes to form a gold-antimony-silicon alloy bond, cooling said wafer to about 100 degrees centigrade over a ten minute period, and depositing a layer of copper on said gold-antimony layer by displacement of copper ions from an electrolyte by immersing the wafer in an electrolyte comprising copper sulfate and hydrofluoric acid.

2. The method in accordance with claim 1 which includes passing a current through said electrolyte to said wafer.

3. The method in accordance with claim 1 in which said displacement is chemical and occurs solely as the result of the inherent electrode potential between silicon and copper.

References Cited in the file of this patent

UNITED STATES PATENTS

| | | |
|---|---|---|
| 946,903 | Kern | Jan. 18, 1910 |
| 1,045,715 | Marino | Apr. 29, 1912 |
| 1,987,749 | Pine | Jan. 15, 1935 |
| 2,402,661 | Ohl | June 25, 1946 |
| 2,496,569 | Ohl | May 10, 1949 |
| 2,580,773 | Heiman | Jan. 1, 1952 |
| 2,654,702 | De Long | Oct. 6, 1953 |
| 2,657,114 | Wagner | Oct. 27, 1954 |
| 2,728,720 | De Long | Dec. 27, 1955 |
| 2,735,808 | Greenspan | Feb. 21, 1956 |